United States Patent
Fan et al.

(10) Patent No.: US 6,455,376 B1
(45) Date of Patent: Sep. 24, 2002

(54) METHOD OF FABRICATING FLASH MEMORY WITH SHALLOW AND DEEP JUNCTIONS

(75) Inventors: Tso Hung Fan, Taipei Hsien; Wen-Jer Tsai, Hualian; Tao-Cheng Lu, Koashiung, all of (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/874,455

(22) Filed: Jun. 5, 2001

(30) Foreign Application Priority Data

Mar. 23, 2001 (TW) .............................................. 9016862

(51) Int. Cl.[7] ......................................... H01L 21/8247
(52) U.S. Cl. ........................ 438/264; 438/307; 438/549
(58) Field of Search ................................. 438/257, 264, 438/305, 306, 307, 529, 545, 549

(56) References Cited

U.S. PATENT DOCUMENTS 6,037,223 A * 3/2000 Su et al. ..................... 438/264
6,057,192 A * 5/2000 Colabella .................... 438/264
6,329,247 B1 * 12/2001 Ito .............................. 438/264

* cited by examiner

Primary Examiner—Chandra Chaudhari
(74) Attorney, Agent, or Firm—J.C. Patents

(57) ABSTRACT

A method of fabricating a flash memory is disclosed. The method begins a stacked gate on the substrate. A shallow junction doping is performed on a substrate having a stacked gate already formed thereon, with the stacked gate serving as a mask, so as to form a shallow junction doped region in the substrate adjacent to both sides of the stacked gate. A mask layer is formed on the substrate to cover a top surface and sidewalls of the stacked gate, while exposing portions of the shallow junction doped region. With the mask layer serving as a mask, a deep junction doping is performed on the substrate to form a deep junction doped region in the substrate adjacent to both sides of the mask layer. After the mask layer is removed, a thermal process is performed to form a source/drain region having both the shallow junction doped region and deep junction doped region.

20 Claims, 2 Drawing Sheets

METHOD OF FABRICATING FLASH MEMORY WITH SHALLOW AND DEEP JUNCTIONS

CROSS-REFERENCE TO RELATED APPLICATION

This application claims the priority benefit of Taiwan application serial no. 90106862, filed Mar. 23, 2001.

BACKGROUND OF THE INVENTION

1. Field of Invention

The present invention relates to a method of fabricating a memory. More particularly, the present invention relates to a method of fabricating a flash memory.

2. Description of Related Art

A flash memory is a non-volatile memory that can be programmable, erasable, and capable of saving data even after the power is cut off. It is a memory device that is widely adopted in manufacturing of personal computer (PC) and other electronic equipments.

Conventional method for fabricating a transistor memory cell usually involves, after formation of a stacked gate constituted of a tunnel oxide layer, a floating gate, a dielectric layer, and a control gate, performing a doping step on the substrate, with the stacked gate serving as a mask. With a long period of high temperature annealing, a source/drain region with a deeper junction is formed. Depending upon the specific channel length, an appropriate bias is supplied to the source/drain region. Next, hot electrons are produced in the channel by performing a channel hot electron injection, with some electrons passing through the tunnel oxide layer to the floating gate for programming the device. Besides, the source/drain region in the memory also serves as a diffusion path that connects to a bit line.

With a trend of high device integration, the device size is reduced according to the design rule, while the channel length of the floating gate is also reduced. Meanwhile, a depletion region produced from the source/drain region further reduces the channel length in such a way that the depletion region of the source may overlap with that of the drain. This has made problems such as short channel effect and punch-through leakage seem worse.

To resolve the problems associated with the increased device integration, the source/drain needs to be formed with a shallow drain junction. The shallow drain junction may have improved from the problems mentioned above, but with a shallow depth of the source/drain, the bit line that connects to the source/drain may show an increase of resistance, resulting a voltage drop at a junction where the bit line is connected to the source/drain. So, when the device is programmed by a channel hot electron injection, a large bias is supplied to the source/drain. This causes a serious loading effect since the voltage drop would have reduced the actual bias.

Summarizing the above, in the case where the size of the device is minimized, if the shallow drain junction is adopted to solve the short channel effect and the punch-through leakage, a loading effect of the source/drain would occur as a result. On the other hand, if the drain junction were deepened to resolve the loading effect, short channel effect and the punch through leakage would once again be a problem. Therefore, for the foregoing reasons stated above, the conventional fabrication methods for the flash memory cannot solve all the problems at once. Accordingly, it is difficult to practically reduce the size of the device during the fabrication.

SUMMARY OF THE INVENTION

The present invention provides a method of fabricating a flash memory to effectively improve from the short channel effect and punch through leakage.

The present invention also provides a method of fabricating the flash memory to reduce resistance at a junction where the bit line is connected to the source/drain, so as to improve from the loading effect.

The present invention further provides a method of fabricating the flash memory to reduces the size of the device while increasing the device integration.

To achieve these and other advantages and in accordance with the purpose of the invention, a method of fabricating the flash memory is provided, which method begins by providing a substrate. A stacked gate constituted of a tunnel oxide layer, a floating gate, a dielectric layer, and a control gate is formed on the substrate. A shallow junction doping is then performed on the substrate, with the stacked gate serving as a mask, so as to form a shallow junction doped region in the substrate adjacent to both sides of the stacked gate. A mask layer is formed on the substrate to cover a top surface and sidewalls of the stacked gate, while exposing portions of the shallow junction doped region. With the mask layer serving as a mask, a deep junction doping is further performed on the substrate to form a deep junction doped region in the substrate adjacent to both sides of the mask layer. After the mask layer is removed, a thermal process is performed to form a source/drain region having both the shallow junction doped region and deep junction doped region.

As embodied and broadly described herein, the source/drain regions having both shallow drain junction and a deep drain junction are formed according to the invention. Since the flash memory is formed as described above, formation of depletion regions of the source/drain regions can be effectively controlled, even if the channel length is reduced. Consequently, this improves from the short channel effect that is resulted from further reduction of the channel length caused by the depletion regions. Also, this improves from the punch through leakage produced outside the channel due to a close proximity of the depletion regions of the source/drain regions.

While a junction is made between the shallow drain junction and the bit line, a rise in resistance may be induced as a result of an insufficient junction depth. This leads to a voltage drop at the junction, resulting a loading effect. According to the present invention, the source/drain regions do not only provide the shallow drain junction, but also provide the deep drain junction. Therefore, the resistance of the source/drain regions is reduced, while the loading effect resulted from the insufficient junction depth of the source/drain regions is also effectively reduced.

Furthermore, since the source/drain regions of the flash memory formed according to the invention have both the shallow drain junction and the deep drain junction, problems such as short channel effect, punch-through leakage, loading effect and so on can all be effectively resolved at once. For the foregoing reason, it is appropriate to apply the method of the invention for designing the device with a minimized size. Accordingly, the memory device with a short channel can be manufactured, which in turn improves the integration of the memory device.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
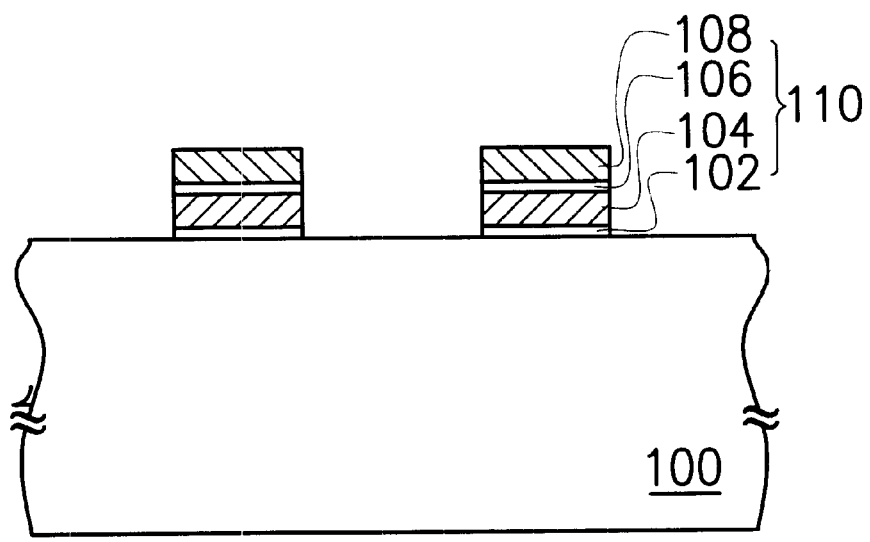
FIGS. 1A through 1D are schematic cross-sectional views showing the fabrication method for a flash memory according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1D are schematic cross-sectional views showing the fabrication method for a flash memory according to one preferred embodiment of this invention.

Referring to FIG. 1A, a substrate 100 is provided, on which forms a stacked gate 110 constituted of a tunnel oxide layer 102, a floating gate 104, a dielectric layer 106, and a control gate 108. The method of forming the stacked gate 110 comprises of forming in sequence a thermal oxide layer (not shown), a first conductive layer (not shown), an oxide layer (not shown), and a second conductive layer (not shown), followed by patterning the thermal oxide layer, the first conductive layer, the oxide layer, and the second conductive layer to form the stacked gate 110 constituted of the tunnel oxide layer 102, the floating gate 104, the dielectric layer 106, and the control gate 108 is formed, while portions of the substrate 100 adjacent to both sides of the stacked gate 110 are exposed.

Figure 1B:
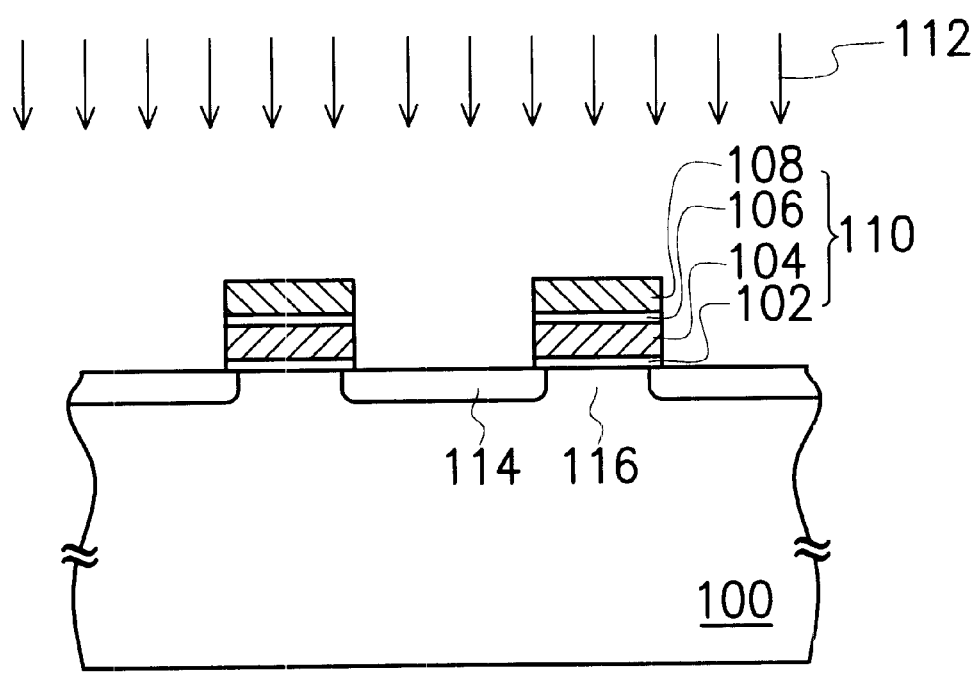

Next, referring to FIG. 1B, a shallow junction doping 112 is performed on the substrate 100 with the stacked gate serving as a mask, so that shallow junction doped regions 114 are formed in portions of the substrate 100 adjacent to both sides of the stacked gate 110. Also, a channel 116 between the shallow junction doped regions 114 is formed below the stacked gate 110. The shallow junction doping 112 includes for example ion implantation process. The doping is performed with an implantation energy of about 1 to 10 keV using a N-dopant, such as Arsenic (As). The dopant is implanted into the portions of the substrate 100 adjacent to both sides of the stacked gate 110 with a dosage of about $1 \times 10^{15}/cm^2$ to $5 \times 10^{15}/cm^2$.

Figure 1C:
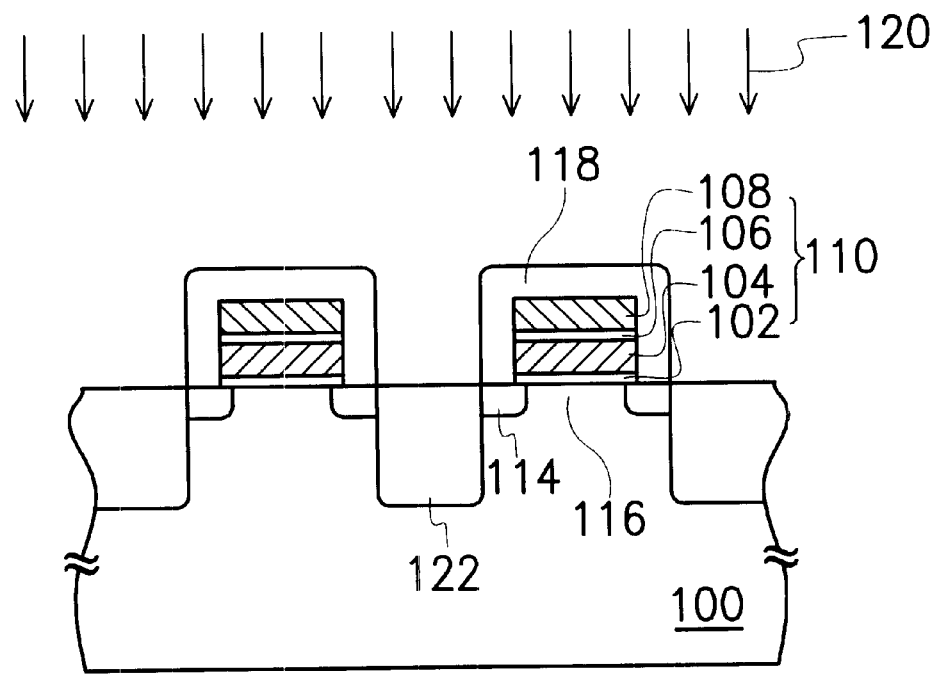

Referring to FIG. 1C, a mask layer 118 is formed on the stacked gate 110, while portions of the shallow junction doped regions 114 are exposed. The method of forming the mask layer 118 includes, for example, forming a photoresist layer (not shown) over the substrate 100, and patterning the photoresist layer for forming the mask layer 118 that covers a top surface and sidewalls of the stacked gate 110, while portions of the shallow junction doped region 114 are exposed. Then, a deep junction doping 120 is performed on the substrate 100, with the mask layer 118 serving as a mask, so that deep junction doped regions 122 are formed in portions of the substrate 100 adjacent to both sides of the stacked gate 110. The deep junction doping 120 includes for example ion implantation process. The doping step is performed with an implantation energy of about 40 to 70 keV using a N-dopant, such as Arsenic (As). The dopant is implanted into the portions of the substrate 100 adjacent to both sides of the mask layer 118 with a dosage of about $1 \times 10^{15}/cm^2$ to $5 \times 10^{15}/cm^2$. As described above, since the mask layer 118 is formed on the top surface and sidewalls of the stacked gate 110, an area of the substrate 100 being exposed is smaller than a width of the shallow junction doped region 114. Therefore, the deep junction doped region 122 formed subsequently has a width narrower than the shallow junction doped region 114.

Figure 1D:
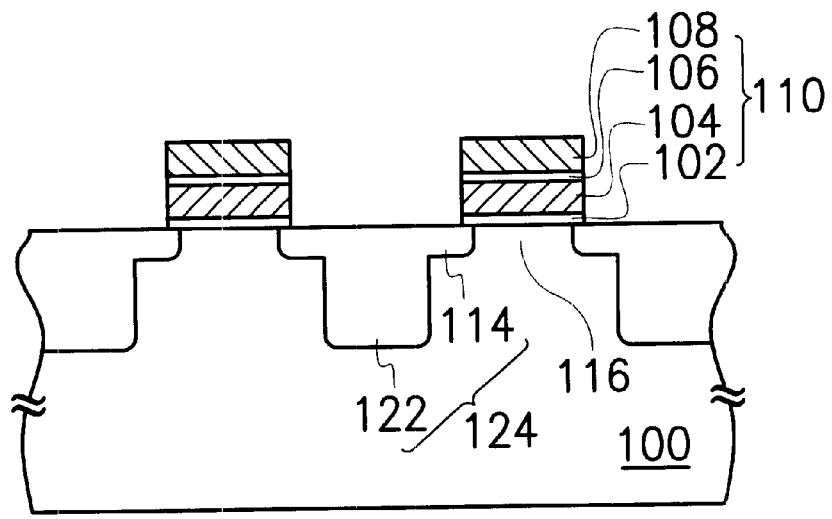

Referring to FIG. 1D, the mask layer 118 is removed. The mask layer 118 may be removed for example, by performing an ashing treatment using oxygen plasma. Next, a thermal treatment is performed, so that source/drain regions 124 are formed from the shallow junction doped regions 114 and the deep junction doped regions 122. Since the source/drain regions 124 formed as such have both a shallow drain junction and a deep drain junction. Therefore, when a length of the channel 116 is shortened, the shallow drain junction can prevent short channel effect and punch through leakage. Also, the deep drain junction can reduce the resistance of the source/drain regions, preventing an occurrence of a loading effect.

Summarizing the above, the source/drain regions having both shallow drain junction and a deep drain junction are formed according to the invention. Since the flash memory is formed as described above, formation of depletion regions of the source/drain regions can be effectively controlled, even if the channel length is reduced. Consequently, this improves from the short channel effect that is resulted from further reduction of the channel length caused by the depletion regions. In addition, this improves from the punch through leakage produced outside the channel due to the close proximity of the depletion regions of the source/drain regions.

While a junction is made between the shallow drain junction and the bit line, a rise in resistance may be induced as a result of an insufficient junction depth. This leads to a voltage drop at the junction, resulting a loading effect. According to the present invention, the source/drain regions do not only provide the shallow drain junction, but also provide the deep drain junction. Therefore, the resistance of the source/drain regions is reduced, while the loading effect resulted from the insufficient junction depth of the source/drain regions is also effectively reduced.

Furthermore, since the source/drain regions of the flash memory formed according to the invention have both the shallow drain junction and the deep drain junction, problems such as short channel effect, punch-through leakage, loading effect and so on can all be effectively resolved at once. For the foregoing reason, it is appropriate to apply the method of the invention for designing the device with a minimized size. Accordingly, the memory device with a short channel can be manufactured, which in turn improves the integration of the memory device.

It will be apparent to those skilled in the art that various modifications and variations can be made to the method of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a flash memory, the method comprising steps of:

providing a substrate with at least a stacked gate formed thereon;

performing a shallow junction doping on the substrate, with the stacked gate serving as a mask, so as to form a shallow junction doped region in the substrate adjacent to both sides of the stacked gate;

forming a mask layer on the substrate, wherein the mask layer covering a top surface and sidewalls of the stacked gate, such that a portion of the shallow junction doped region is exposed;

performing a deep junction doping, with the mask layer serving as a mask, so as to form a deep junction doped region in the substrate adjacent to both sides of the stacked gate; and removing the mask layer.

2. The method of claim 1, wherein the step of performing a shallow junction doping on the substrate includes an ion implantation process.

3. The method of claim 2, wherein the step of performing the shallow junction doping includes an implantation energy of about 1 to 10 keV.

4. The method of claim 2, wherein the step of performing the shallow junction doping includes implanting with a N-type dopant.

5. The method of claim 4, wherein the dopant has an implanting dosage of about $1 \times 10^{15}/cm^2$ to $5 \times 10^{15}/cm^2$.

6. The method of claim 1, wherein the step of forming a mask layer comprising:

forming a photoresist layer on the substrate; and patterning the photoresist layer to form the mask layer.

7. The method of claim 1, wherein the step of performing a deep junction doping on the substrate includes an ion implantation step.

8. The method of claim 7, wherein the step of performing the deep junction doping includes an implantation energy of about 40 to 70 keV.

9. The method of claim 7, wherein the step of performing the deep junction doping includes implanting with a N-type dopant.

10. The method of claim 9, wherein the dopant has an implanting dosage of about $1 \times 10^{15}/cm^2$ to $5 \times 10^{15}/cm^2$.

11. The method of claim 1, wherein the step of performing the shallow junction doping includes the same implanting dosage as that in the step of performing the deep junction doping.

12. The method of claim 1, further includes performing a thermal process after the step of removing the mask layer, thereby forming source/drain regions from the shallow junction doped region and the deep junction doped region.

13. A method of fabricating a flash memory, the method comprising steps of:

providing a substrate with at least a stacked gate formed thereon;

performing a first ion implantation step on the substrate, with the stacked gate serving as a implantation mask, so as to form a shallow junction doped region in the substrate adjacent to both sides of the stacked gate;

forming a photoresist layer on the substrate;

patterning the photoresist layer for forming a mask layer, wherein the mask layer covering a top surface and sidewalls of the stacked gate, such that a portion of the shallow junction doped region is exposed;

performing a second ion implantation step, with the mask layer serving as a implantation mask, so as to form a deep junction doped region in the substrate adjacent to both sides of the stacked gate;

removing the mask layer; and performing a thermal process, so that source/drain regions are formed from the shallow junction doped region and the deep junction doped region.

14. The method of claim 13, wherein the first ion implantation step is performed with an implantation energy of about 1 to 5 keV.

15. The method of claim 14, wherein the first ion implantation step includes implanting with a N-type dopant.

16. The method of claim 14, wherein the first ion implantation step includes an implanting dosage of about $1 \times 10^{15}$ to $5 \times 10^{15}/cm^2$.

17. The method of claim 13, wherein the second ion implantation step is performed with an implantation energy of about 4 to 7 keV.

18. The method of claim 17, wherein the second ion implantation step includes implanting with a N-type dopant.

19. The method of claim 17, wherein the second ion implantation step includes an implanting dosage of about $1 \times 10^{15}$ to $5 \times 10^{15}/cm^2$.

20. The method of claim 13, wherein the first ion implantation step includes the same implanting dosage as that in the second ion implantation step.

* * * * *